(12) United States Patent
Kim et al.

(10) Patent No.: US 7,932,138 B2
(45) Date of Patent: Apr. 26, 2011

(54) METHOD FOR MANUFACTURING THIN FILM TRANSISTOR

(75) Inventors: Hyoung June Kim, Seoul (KR); Dong Hoon Shin, Seoul (KR); Su Kyoung Lee, Seoul (KR); Jung Min Lee, Seoul (KR); Wang Jun Park, Seoul (KR); Sung Ryoung Ryu, Seoul (KR); Hoon Kim, Seoul (KR)

(73) Assignee: Viatron Technologies Inc., Seoul (KR)

( * ) Notice: Subject to any disclaimer, the term of this patent is extended or adjusted under 35 U.S.C. 154(b) by 31 days.

(21) Appl. No.: 12/341,488

(22) Filed: Dec. 22, 2008

(65) Prior Publication Data

US 2009/0170248 A1 Jul. 2, 2009

(30) Foreign Application Priority Data

Dec. 28, 2007 (KR) .................. 10-2007-0140742
Apr. 10, 2008 (KR) .................. 10-2008-0033105

(51) Int. Cl.
*H01L 21/00* (2006.01)

(52) U.S. Cl. ........ 438/151; 438/149; 438/150; 438/161; 438/162; 438/163; 438/164; 438/165; 438/166

(58) Field of Classification Search .......... 438/149–151, 438/161–166
See application file for complete search history.

(56) References Cited

U.S. PATENT DOCUMENTS

| | | | | |
|---|---|---|---|---|
| 6,118,151 A | * | 9/2000 | Tsutsu | 257/347 |
| 6,767,760 B2 | * | 7/2004 | Horikoshi et al. | 438/97 |
| 6,905,920 B2 | * | 6/2005 | Higashi et al. | 438/197 |
| 2003/0094625 A1 | * | 5/2003 | Yamazaki et al. | 257/151 |
| 2004/0108503 A1 | * | 6/2004 | Yamazaki et al. | 257/64 |
| 2004/0142543 A1 | * | 7/2004 | Fukunaga et al. | 438/486 |
| 2004/0224448 A1 | * | 11/2004 | Tanabe | 438/166 |
| 2007/0052023 A1 | * | 3/2007 | Yang et al. | 257/347 |
| 2007/0105285 A1 | * | 5/2007 | Kusumoto et al. | 438/151 |
| 2009/0029507 A1 | * | 1/2009 | Goto et al. | 438/151 |

* cited by examiner

*Primary Examiner* — Kevin M Picardat
*Assistant Examiner* — Bac H Au
(74) *Attorney, Agent, or Firm* — IpHorgan Ltd.

(57) ABSTRACT

A method for manufacturing a thin film transistor with improved current characteristics and high electron mobility. According to the method, when an amorphous silicon thin film is crystallized into a polycrystalline silicon thin film by metal-induced crystallization, annealing conditions of the amorphous silicon thin film and the amount of a metal catalyst doped into the amorphous silicon thin film are optimized to reduce the regions of a metal silicide distributed at grain boundaries of the polycrystalline silicon thin film. In addition, oxygen ($O_2$) gas or water ($H_2O$) vapor is supplied to form a passivation film on the surface of the polycrystalline silicon thin film.

12 Claims, 14 Drawing Sheets
(4 of 14 Drawing Sheet(s) Filed in Color)

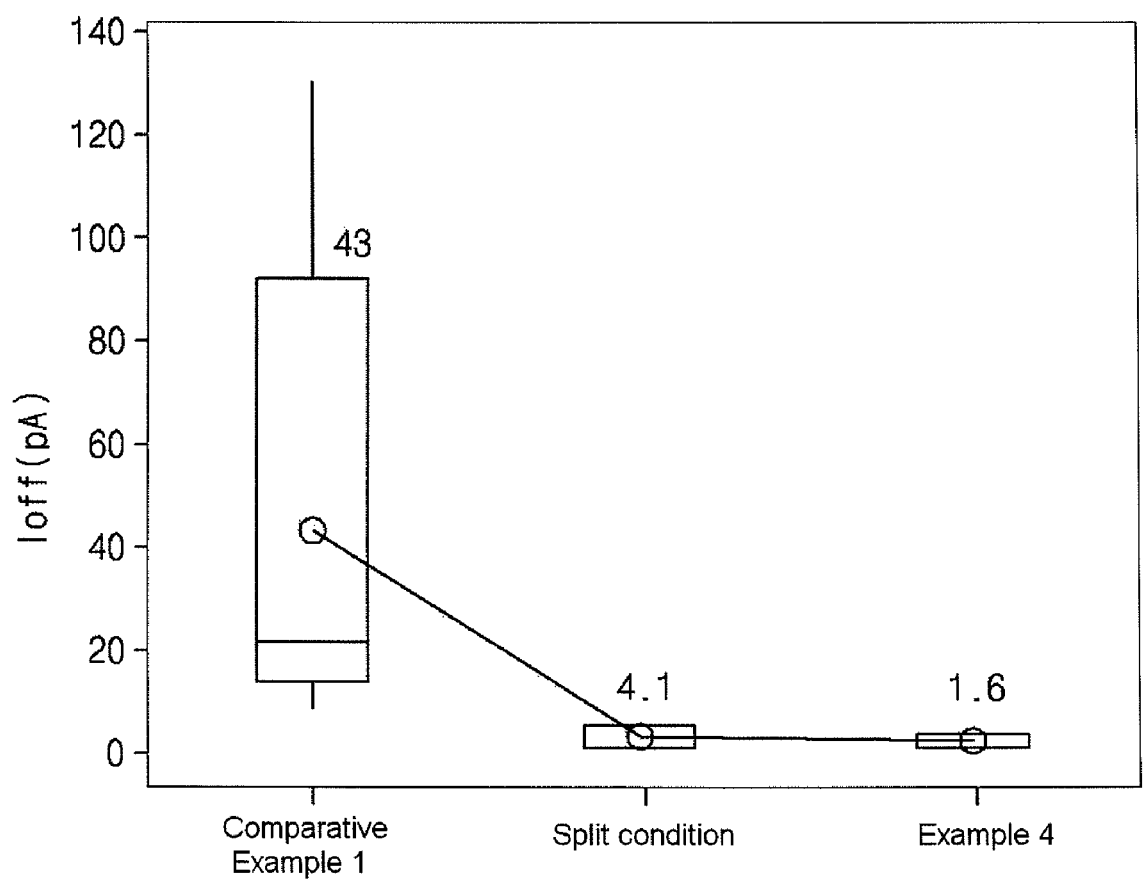

METHOD FOR MANUFACTURING THIN FILM TRANSISTOR

CROSS-REFERENCE TO RELATED APPLICATIONS

This application claims the benefit of Korean Application No. 10-2007-0140742, filed Dec. 28, 2007, and No. 10-2008-0033105, filed Apr. 10, 2008 in the Korean Intellectual Property Office, the disclosures of which are incorporated herein by reference.

BACKGROUND OF THE INVENTION

1. Field of the Invention

Aspects of the present invention relate to a method for manufacturing a thin film transistor with improved current characteristics and high electron mobility in which when an amorphous silicon thin film is crystallized into a polycrystalline silicon thin film by metal-induced crystallization, annealing conditions of the amorphous silicon thin film and the amount of a metal catalyst doped into the amorphous silicon thin film are optimized to reduce the regions of a metal silicide distributed at grain boundaries of the polycrystalline silicon thin film, and in which oxygen ($O_2$) gas or water ($H_2O$) vapor is supplied to form a passivation film on the surface of the polycrystalline silicon thin film.

2. Description of the Related Art

In general, polycrystalline silicon thin films are used in active matrix-liquid crystal displays, active matrix-organic lighting emitting diodes and solar cells. Typically, amorphous silicon thin films are crystallized into polycrystalline silicon thin films by crystallization. Various crystallization methods, such as laser crystallization methods and solid-phase crystallization (SPC) methods (e.g., high-temperature annealing and annealing using a metal catalyst), are currently used for the production of polycrystalline silicon thin films.

Surface silicon dangling bonds, internal grain boundaries and intragranular defects (such as twin defects, interstitial atoms, vacancies and sub-grain boundaries) are present in polycrystalline silicon thin films produced from amorphous silicon thin films, unlike in single-crystal silicon thin films. Such defects impede the migration of electrons and holes in polycrystalline silicon thin films to deteriorate the characteristics of devices (such as transistors) manufactured using the polycrystalline silicon thin films.

Further, a metal silicide (for example, $NiSi_2$) is formed at grain boundaries of a polycrystalline silicon thin film during crystallization to impede the migration of electrons and holes, as shown in FIG. 1. Specifically, the metal silicide is present at grain boundaries of a channel region of a thin film transistor and acts as a defect deteriorating the characteristics (e.g., leakage current characteristics, electron mobility, and threshold voltage characteristics) of the device. Thus, the absence of metal silicide lines is needed to improve the leakage current characteristics of the thin film transistor.

Research on hydrogen passivation has been conducted to remove defects from polycrystalline silicon thin films. For example, a polycrystalline silicon thin film is passivated by hydrogen ($H_2$) plasma passivation or annealing under a hydrogen atmosphere. The hydrogen added for the passivation of the polycrystalline silicon thin film is bonded to silicon dangling bonds of the polycrystalline silicon thin film. This bonding electrically neutralizes the polycrystalline silicon thin film and prevents defects from impeding the migration of electrons and holes in the polycrystalline silicon thin film.

However, a disadvantage of the hydrogen plasma passivation is that plasma may do damage to the surface of polycrystalline silicon thin films to degrade the characteristics of devices using the polycrystalline silicon thin films. The hydrogen atmosphere annealing may be performed by i) a method in which a silicon nitride thin film ($SiN_x$) containing a large amount of hydrogen is formed on a polycrystalline silicon thin film and the hydrogen is diffused into the polycrystalline silicon thin film during annealing or ii) a method in which hydrogen is diffused into a polycrystalline silicon thin film during annealing under a hydrogen atmosphere. The method ii) has the disadvantage of long processing time resulting from slow hydrogen diffusion.

Further, when the temperature of a transistor increases, Si—H bonds formed by the passivation method can be easily split into hydrogen and silicon atoms, resulting in deterioration in the reliability of the transistor depending on the conditions of use.

SUMMARY OF THE INVENTION

Aspects of the present invention provide a method for manufacturing a thin film transistor with improved current characteristics and high electron mobility by which the regions of a metal silicide distributed at grain boundaries of a polycrystalline silicon thin film can be reduced.

Another aspect of the present invention provides a method for manufacturing a thin film transistor with improved current characteristics and high electron mobility in which $O_2$ gas or $H_2O$ vapor is supplied to form a passivation film on a polycrystalline silicon thin film.

Another aspect of the present invention provides a method for manufacturing a thin film transistor in which $O_2$ gas or $H_2O$ vapor is used to strongly passivate silicon dangling bonds present on the surface of a polycrystalline silicon thin film.

An embodiment of the present invention provides a method for manufacturing a thin film transistor that comprises forming an amorphous silicon thin film on an insulating substrate, crystallizing the amorphous silicon thin film to form a polycrystalline silicon thin film, supplying oxygen ($O_2$) gas or water ($H_2O$) vapor to the surface of the polycrystalline silicon thin film to form an oxide film as a passivation film on the polycrystalline silicon thin film (first passivation), patterning the polycrystalline silicon thin film and the passivation film to transform the polycrystalline silicon thin film into an active layer, forming a gate insulating film over the polycrystalline silicon thin film and the passivation film, forming a gate electrode on the gate insulating film and dividing the polycrystalline silicon thin film into a channel region opposite to the gate electrode and first and second regions separated by the channel region, implanting a p-type or n-type dopant into the first and second regions to form source/drain regions, forming an interlayer insulating film over the gate electrode and the gate insulating film, etching the interlayer insulating film, the gate insulating film and the passivation film to form a first contact hole and a second contact hole in contact with the source and drain regions, respectively, and forming a source electrode and a drain electrode in contact with the source region and the drain region through the first and second contact holes, respectively.

According to another aspect of the present invention, the method may further comprise forming a buffer layer between the upper surface of the insulating substrate and the amorphous silicon thin film.

According to another aspect of the present invention, the amorphous silicon thin film may be doped with a metal catalyst and may be annealed at a temperature of 600 to 850° C. for 5 to 150 minutes.

According to another aspect of the present invention, the amorphous silicon thin film may be crystallized at a temperature of at least 800° C. by solid-phase crystallization.

According to another aspect of the present invention, the crystallization of the amorphous silicon thin film may be carried out by annealing in such a manner that the annealing time becomes shorter as the annealing temperature increases. According to another aspect of the present invention, the amorphous silicon thin film may be doped with a metal catalyst at a concentration of from $1 \times 10^{11}$ to $1 \times 10^{16}$/cm².

According to another aspect of the present invention, the first passivation may be carried out by heating and cooling the amorphous silicon thin film.

According to another aspect of the present invention, the first passivation may be carried out at a temperature of 700 to 800° C. According to another aspect of the present invention, the $H_2O$ vapor may be produced by the reaction of hydrogen ($H_2$) and oxygen ($O_2$) at a temperature of 700 to 900° C. ('pyrotorch technique') or by heating deionized water to at least 20° C.

According to another aspect of the present invention, the passivation film may have a thickness of a single atomic layer to hundreds of angstroms.

According to another aspect of the present invention, the method may further comprise supplying $O_2$ gas or $H_2O$ vapor to the upper surfaces of the source and drain regions to passivate the active layer (second passivation) after the step of forming the contact holes. According to another aspect of the present invention, the second passivation may be carried out at a temperature of 200 to 600° C.

According to another aspect of the present invention, the first passivation and the second passivation may be carried out in an in-line system having a plurality of independent chambers or a vertical tube furnace having a vertically standing chamber.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and/or other aspects and advantages of the invention will become apparent and more readily appreciated from the following description of the embodiments, taken in conjunction with the accompanying drawings of which:

FIGS. 3*a* through 3*l* illustrate process diagrams corresponding to the individual steps shown in the flow chart of FIG. 2;

FIGS. 14*a* and 14*b* show the off-current ($I_{off}$) and electron mobility of thin film transistors manufactured in Example 4 and Comparative Example 1.

DETAILED DESCRIPTION OF THE PREFERRED EMBODIMENTS

Figure 1:
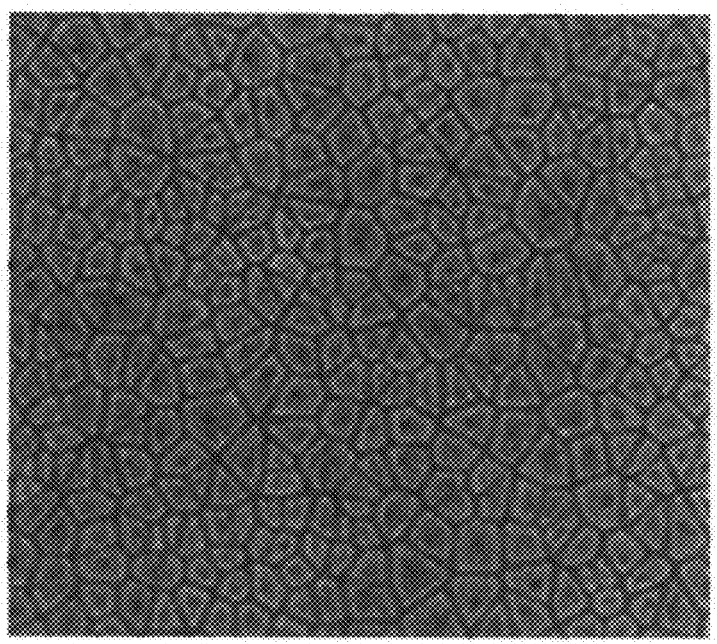
FIG. 1 is an electron micrograph showing NiSi₂ present at grain boundaries of a polycrystalline silicon thin film.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
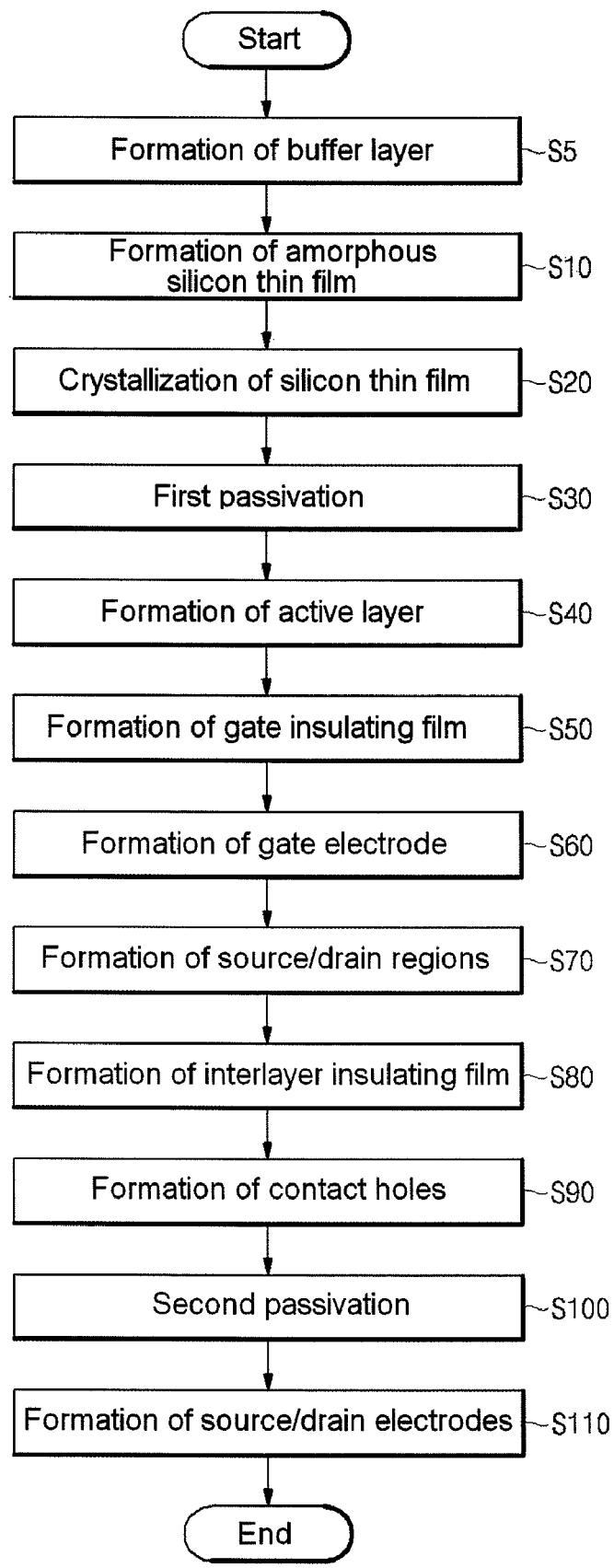
FIG. 2 is a flow chart of a method for manufacturing a thin film transistor according to an embodiment of the present invention.

FIG. 2 is a flow chart of a method for manufacturing a thin film transistor according to an embodiment of the present invention, and FIGS. 3*a* through 3*l* illustrate process diagrams corresponding to the individual steps shown in the flow chart of FIG. 2.

Referring to FIG. 2, the method comprises the following steps: formation of an amorphous silicon thin film (S10), crystallization of the amorphous silicon thin film (S20), first passivation (S30), formation of an active layer (S40), formation of a gate insulating film (S50), formation of a gate electrode (S60), and formation of source and drain regions (S70). The method may further comprise forming a buffer layer (S5). The method may further comprise the following steps: formation of an interlayer insulating film (S80), formation of contact holes (S90), second passivation (S100), and formation of source and drain electrodes (S110).

In an embodiment, the amorphous silicon thin film is crystallized to form a polycrystalline silicon thin film and O₂ gas or H₂O vapor is used to form a passivation film on the polycrystalline silicon thin film. At this time, the passivation film may be an oxide film formed by oxidation of the polycrystalline silicon thin film depending on the crystallization temperature. In another embodiment, the passivation film may be formed during heating from room temperature to a higher temperature or cooling from the higher temperature to room temperature for the crystallization of the amorphous silicon thin film.

In another embodiment, a metal catalyst capable of accelerating crystallization may be doped into the amorphous silicon thin film to form a polycrystalline silicon thin film, and annealing temperature and time may be optimized to decrease the amount of a metal compound of the metal catalyst deposited at grain boundaries of the polycrystalline silicon thin film.

In another embodiment, the crystallization may be carried out together with the first passivation in an in-line system as annealing equipment that consists of a plurality of independently controlled chambers to increase or decrease the temperature of the amorphous silicon thin film. In another embodiment, $O_2$ gas or $H_2O$ vapor may be supplied to the chambers of the in-line system to passivate the polycrystalline silicon thin film. Specifically, $O_2$ gas or $H_2O$ vapor is supplied to the chambers where the amorphous silicon thin film is heated or cooled in the course of crystallization to passivate the polycrystalline silicon thin film.

The in-line system was already disclosed in Korean Patent Application No. 10-2005-0017003, 10-2005-0017004 and 10-2005-0017005 entitled "annealing system for semiconductor device", which were filed by the present applicant in Korea, and a detailed description thereof is omitted herein.

In an alternative embodiment, the crystallization, the first passivation and the second passivation may be carried out in a vertical tube furnace. Specifically, the crystallization can be carried out by loading the amorphous silicon thin film formed on the insulating substrate into the vertical tube furnace, followed by heating and cooling; and the passivation can be carried out by supplying $O_2$ gas or $H_2O$ vapor through a nozzle installed on top of the vertical tube furnace to maintain the furnace under an $O_2$ or $H_2O$ atmosphere as a whole or by directly spraying $O_2$ gas or $H_2O$ vapor on the surface of the amorphous silicon thin film formed on the insulating substrate through a plurality of nozzles installed above the amorphous silicon thin film. The vertical tube furnace is a system widely used in semiconductor manufacturing processes, and a detailed description thereof is omitted herein.

Figure 3A:
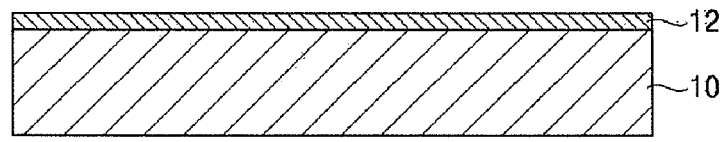

Referring to FIG. 3a, in step S5, a buffer layer 12 is formed using an insulating material such as silicon oxide on the upper surface of an insulating substrate 10. The insulating substrate 10 may be made of single-crystal silicon, single-crystal silicon carbide, glass, quartz or plastic. The buffer layer 12 may be a silicon oxide film ($SiO_x$), a silicon nitride film ($SiN_x$) or a bilayer thereof. The buffer layer 12 may be formed by plasma-enhanced chemical vapor deposition (PECVD) or low-pressure chemical vapor deposition (LPCVD). The buffer layer 12 serves to prevent moisture or impurities generated in the insulating substrate 10 from diffusing into an amorphous silicon thin film formed on the insulating substrate in the subsequent step.

Step S5 may not be carried out when there is no possibility that moisture or impurities may be diffused into the amorphous silicon thin film from the insulating substrate 10. That is, the buffer layer 12 is not formed on the upper surface of the insulating substrate 10.

Figure 3B:
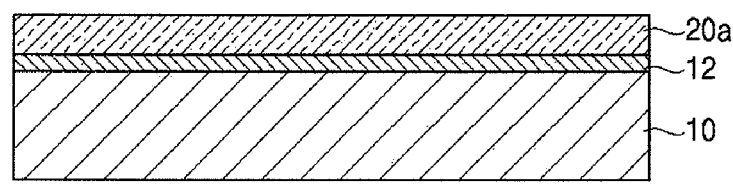

Referring to FIG. 3b, in step S10, an amorphous silicon thin film 20 is formed on the insulating substrate 10. The amorphous silicon thin film 20 is formed on the insulating substrate 10 or the upper surface of the buffer layer 12. In the case where the buffer layer 12 is not formed on the upper surface of the insulating substrate 10, the amorphous silicon thin film 20a is directly formed on the upper surface of the insulating substrate 10. The amorphous silicon thin film 20a may be formed by chemical vapor deposition or physical vapor deposition.

Figure 3C:
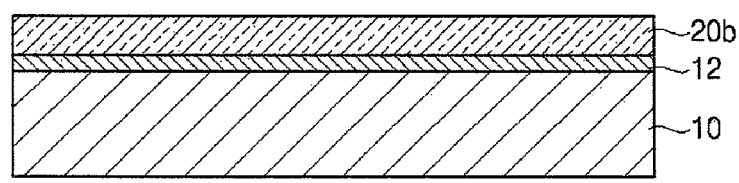

Referring to FIG. 3c, in step S30, the amorphous silicon thin film 20a is crystallized to form a polycrystalline silicon thin film 20b. The polycrystalline silicon thin film 20b is formed by metal-induced crystallization of the amorphous silicon thin film 20a.

Step 20 includes doping the amorphous silicon thin film with a metal catalyst and annealing the doped amorphous silicon thin film.

The doping is performed by doping a metal catalyst into the upper surface of the amorphous silicon thin film. This doping allows bonding of the metal catalyst to the silicon of the amorphous silicon layer to form a metal silicide. The metal silicide acts as a nucleus (i.e. seed) for crystallization to induce the crystallization of the amorphous silicon layer.

The metal catalyst may be selected from the group consisting of Ni, Pd, Ti, Ag, Au, Al, Sn, Sb, Cu, Co, Mo, Tr, Ru, Rh, Cd and Pt. Nickel (Ni) is preferred.

The metal catalyst is preferably doped at a concentration of $1\times10^{11}$ to $1\times10^{16}/cm^2$. If the concentration of the metal catalyst is too low, the amorphous silicon thin film may be insufficiently crystallized or may take a long time to crystallize. Meanwhile, if the concentration of the metal catalyst is too high, the grains are excessively reduced in size during the crystallization into the polycrystalline silicon thin film, which deteriorates the current characteristics and electron mobility of the final transistor. The presence of the excess metal catalyst in the polycrystalline silicon thin film also causes deterioration in the characteristics of the final transistor.

The amorphous silicon thin film doped with the metal catalyst is crystallized into the polycrystalline silicon thin film by annealing. The annealing is preferably performed in the temperature range of 600 to 850° C. for 5 to 150 minutes. The annealing time may be set to be shorter at a higher annealing temperature. This is because the crystallization rate of the amorphous silicon thin film is rapid at a high annealing temperature to accomplish sufficient crystallization of the amorphous silicon thin film despite a short annealing time.

As the annealing proceeds, the metal silicide present at grain boundaries of the polycrystalline silicon thin film is distributed at specific locations of the grain boundaries. For example, the metal silicide is localized at corners where the grain boundaries meet. Accordingly, the regions of the metal silicide present at grain boundaries of the polycrystalline silicon thin film are reduced, leading to an improvement in the characteristics (e.g., current characteristics and electron mobility) of the transistor.

If the annealing is performed at a temperature lower than 600° C., the metal silicide is distributed throughout the grain boundaries of the polycrystalline silicon thin film, resulting in a deterioration in the characteristics of the polycrystalline silicon thin film, and the amorphous silicon thin film may be insufficiently crystallized. Meanwhile, if the annealing is performed at a temperature higher than 850° C., glass as the insulating substrate may be deformed.

If the annealing time is shorter than 5 minutes, the metal silicide is distributed throughout the grain boundaries of the polycrystalline silicon thin film, resulting in a deterioration in the characteristics of the polycrystalline silicon thin film, and the amorphous silicon thin film may be insufficiently crystallized. Meanwhile, even if the annealing time is longer than 150 minutes, little improvement in the crystallization effects is produced by the additional annealing.

The amorphous silicon thin film 20a can be crystallized by solid-phase crystallization (SPC) or excimer laser crystallization (ELC). According to the solid-phase crystallization, the amorphous silicon thin film 20a formed on the insulating substrate 10 is crystallized by annealing at 600° C. or higher. According to the excimer laser crystallization, the amorphous silicon thin film 20a formed on the insulating substrate 10 is momentarily melted by irradiation with a high-energy laser, followed by cooling to form the polycrystalline silicon thin film 20b.

Rapid thermal processing by induction heating may be employed when the amorphous silicon thin film 20a is crystallized by solid-phase crystallization. In this case, it is preferred to carry out step S20 in a system where rapid thermal processing can be performed. In step S20, the amorphous silicon thin film 20a formed on the insulating substrate 10 is heated to 700° C. or higher and is then heated to 800° C. or higher by rapid thermal processing to crystallize the amorphous silicon thin film 20 into the polycrystalline silicon thin film 20b. Thereafter, the polycrystalline silicon thin film 20b formed on the insulating substrate 10 is allowed to slowly cool. Glass as the insulating substrate 10 may be deformed upon heating to 600° C. or higher. To prevent the insulating substrate 10 from being deformed by heating, the insulating substrate 10 is loaded into an annealing system while being rested on a setter. The setter supports the entire lower surface of the insulating substrate 10. As a result, the insulating substrate 10 can withstand annealing at 800° C. or higher by induction heating for a short time without any deformation.

In step S20, the amorphous silicon thin film may be crystallized into a polycrystalline silicon thin film by forming a monolayer or multilayer capping layer (not shown) on the upper surface of the amorphous silicon thin film, forming a metal catalyst layer on the capping layer, followed by annealing to diffuse the metal catalyst into the amorphous silicon thin film. This process is called 'super grain silicon (SGS) crystallization'. According to the SGS crystallization, the grain size of the polycrystalline silicon thin film can be controlled by varying the amount of the metal catalyst supplied to the amorphous silicon thin film. The SGS crystallization is a process generally used for the crystallization of amorphous silicon, and a detailed description thereof is omitted herein.

Figure 3D:
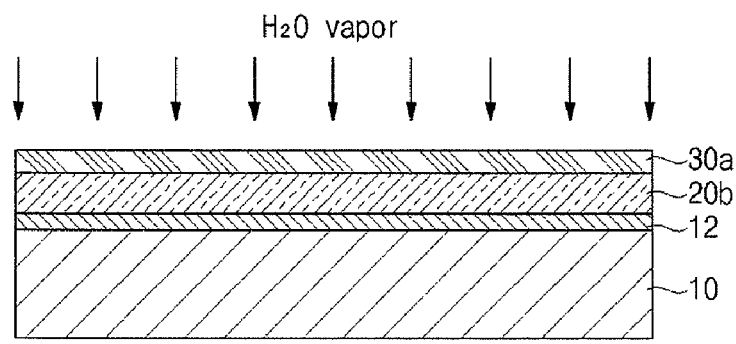

Referring to FIG. 3d, in step S30, $H_2O$ vapor is supplied to the surface of the polycrystalline silicon thin film 20b to form a passivation film 30a on the surface of the polycrystalline silicon thin film 20b. The passivation film 30a may be a silicon oxide film formed by oxidizing the surface of the polycrystalline silicon thin film 20b using $O_2$ gas or $H_2O$ vapor. The surface oxidation of the polycrystalline silicon thin film 20b decreases the number of dangling bonds present on the surface of the polycrystalline silicon thin film 20b. Further, the $O_2$ gas or $H_2O$ vapor is diffused into the polycrystalline silicon thin film to form Si—H and/or Si—O bonds within the polycrystalline silicon thin film during the formation of the passivation film 30a, and as a result, the density of trap sites impeding the migration of electrons and holes on the surface and within the polycrystalline silicon thin film 20b is decreased.

On the other hand, step S30 may also be applicable in the course of forming the polycrystalline silicon thin film. That is, $O_2$ gas or $H_2O$ vapor added during heating of the amorphous silicon thin film reacts with Ni as the metal catalyst present on the surface of the amorphous silicon thin film to decrease the amount of the metal catalyst remaining within the polycrystalline silicon thin film and oxidize $NiSi_2$, which impedes the migration of electrons or holes in the final transistor during operation, after crystallization. This oxidation improves the operational characteristics of the transistor.

The $H_2O$ vapor is may be produced by heating deionized water to at least 20° C. and preferably at least 100° C. or by the reaction of hydrogen ($H_2$) and oxygen ($O_2$) at a temperature of 700 to 900° C. ('pyrotorch technique'). When the deionized water is heated to 100° C. or lower, ultrasonic waves are used to supply $H_2O$ vapor. It is preferred to produce the $H_2O$ vapor by water vapor synthesis. The ratio of hydrogen and oxygen supplied for the water vapor synthesis is between 1:1 and 2:1. The $H_2O$ vapor produced at a high temperature is pure, has good quality and leaves no water marks on the upper surface of the thin film to which the vapor is supplied. The $O_2$ gas is directly supplied in a pure form.

Step S30 may be carried out by supplying $O_2$ gas or $H_2O$ vapor to the polycrystalline silicon thin film 20b during cooling from a high temperature to room temperature in step S20. That is, step S30 may be carried out at a temperature of 400 to 800° C. during cooling. Alternatively, step S30 may be carried out by supplying $O_2$ gas or $H_2O$ vapor to the polycrystalline silicon thin film 20b during heating from room temperature to a high temperature and induction annealing in step S20. That is, step S30 may be carried out at a temperature of 700 to 800° C. during heating and at a temperature of 850° C. or higher during induction annealing.

The passivation film 30a may have a thickness of a single atomic layer to hundreds of angstroms depending on the processing temperature and time. If a portion of the passivation film 30a is below the single atomic layer level (i.e. the passivation film 30a is partially passivated), the characteristics of the passivation film 30a may not be uniform. If the thickness of the passivation film 30a is above the level of hundreds of angstroms, a long processing time is needed. Therefore, it is preferred to limit the thickness of the passivation film 30a below the level of hundreds of angstroms.

Figure 3E:
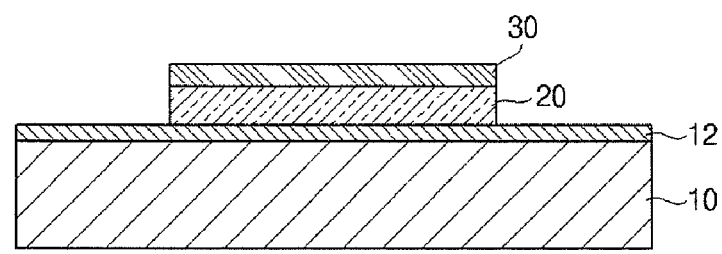

Referring to FIG. 3e, in step S40, the polycrystalline silicon thin film 20b is patterned into an active layer 20 having a predetermined area. The patterning is performed such that the active layer 20 has an area and a shape depending on the desired design of the thin film transistor. The passivation film 30a is patterned together with the polycrystalline silicon thin film 20b to have a shape corresponding to the active layer 20. The active layer 20 is divided into a first region, a second region and a channel region in the subsequent step.

Figure 3F:
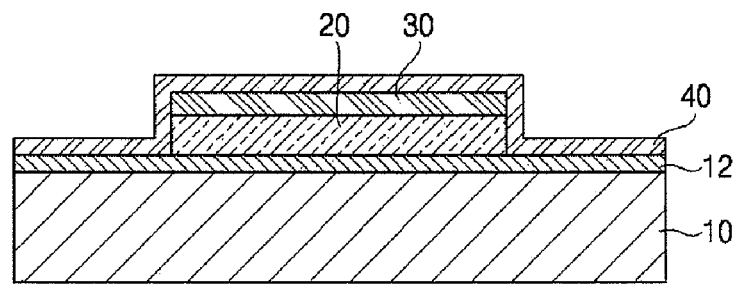

Referring to FIG. 3f, in step S50, a gate insulating film 40 is formed over the active layer 20 and the passivation film 30 and the insulating substrate 10. The gate insulating film 40 is formed by chemical vapor deposition or plasma-enhanced chemical vapor deposition. The gate insulating film 40 is formed of an oxide or nitride and has a thickness of approximately 1,000 Å.

Steps S40 and S50 may be carried out in the reverse order, if needed. In this case, the formation of the active layer makes the gate insulating film discontinuous in shape over the entire surface of the substrate.

Figure 3G:
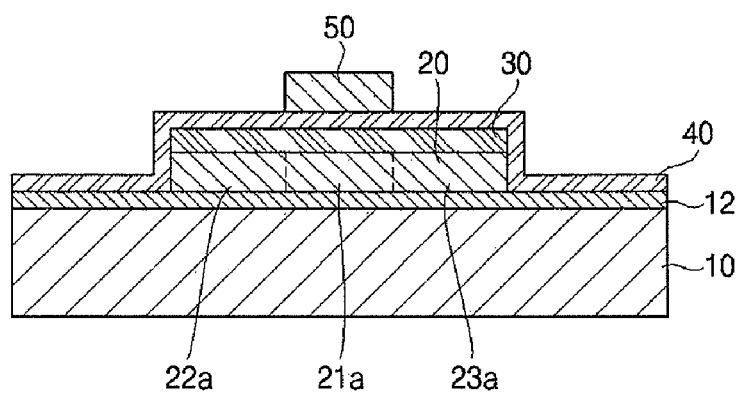

Referring to FIG. 3g, in step S60, a gate electrode 50 is formed on the gate insulating film 40. More specifically, the gate electrode 50 can be formed by forming a gate electrode film over the entire upper surface of the gate insulating film 40 and etching the gate electrode film or lifting-off the gate electrode film using a patterned photoresist. The gate electrode film can be patterned into the gate electrode 50 by dry or wet etching. The active layer 20 is divided into a channel region 21a opposite to the gate electrode 50 and first and second regions 22a and 23a separated by the channel region 21a.

The gate electrode 50 is a metal layer or a laminate of different metal layers. The metal layer is composed of aluminum (Al), an aluminum alloy, such as aluminum-neodymium (Al—Nd), chromium, or molybdenum (Mo). The gate electrode 50 is formed to a thickness of approximately 2,000 to 3,000 Å.

Figure 3H:
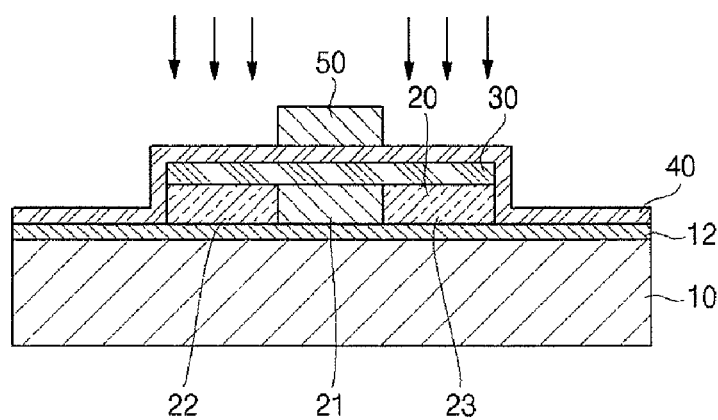

Referring to FIG. 3h, in step S70, a dopant is implanted into the first and second regions 22a and 23a of the active layer 20 to form a source region 22 and a drain region 23, respectively.

The dopant may be either p-type or n-type. The p-type dopant may be selected from the group consisting of boron (B), aluminum (Al), gallium (Ga), indium (In), and mixtures thereof. The n-type dopant may be phosphorus (P).

Figure 3I:
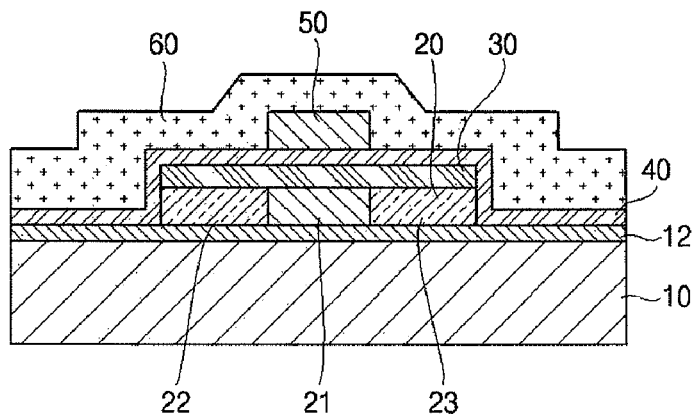

Referring to FIG. 3i, in step S80, an interlayer insulating film 60 is formed over the entire surface of the gate insulating film 40 and the gate electrode 50. The interlayer insulating film 60 is formed by chemical vapor deposition or plasma-enhanced chemical vapor deposition. The interlayer insulating film 60 is formed of an oxide or nitride.

Figure 3J:
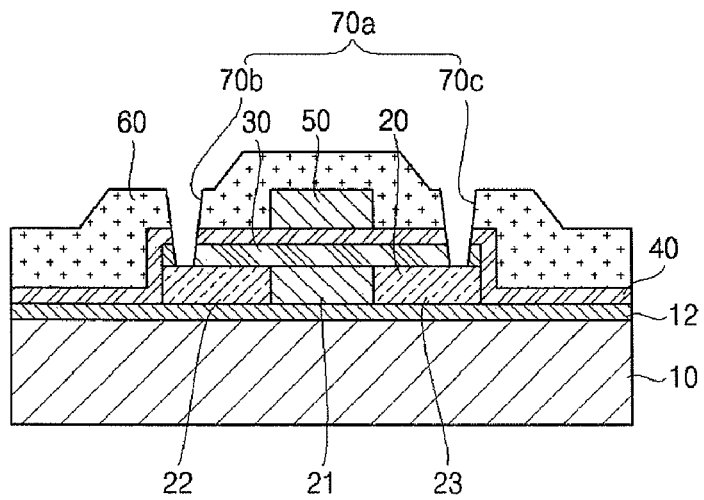

Referring to FIG. 3j, in step S90, predetermined portions of the interlayer insulating film 60, the gate insulating film 40 and the passivation film 30 are etched to form contact holes 70a (70b and 70c). The contact holes 70a are formed so as to expose portions of the upper surfaces of the source region 22 and the drain region 23. The first contact hole 70b is formed on the source region 22 and the second contact hole 70c is formed on the drain region 23.

Figure 3K:
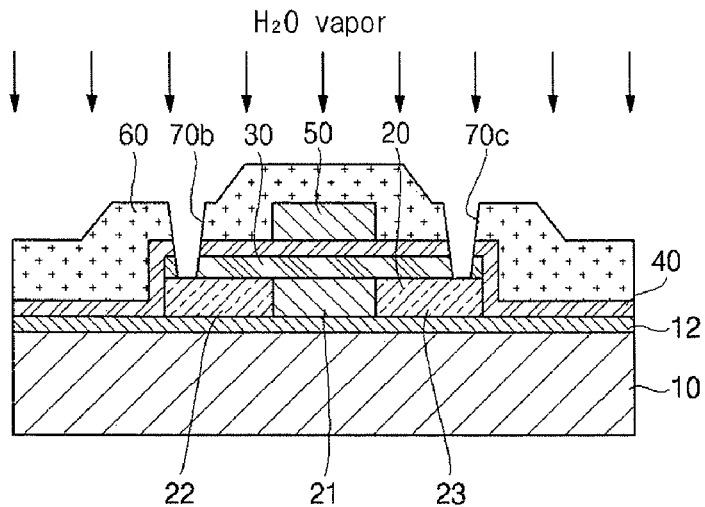
Figure 3I:
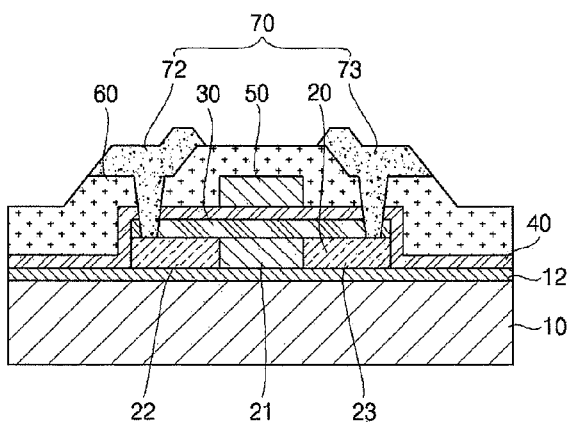

Referring to FIG. 3k, in step S100, $O_2$ gas or $H_2O$ vapor is supplied to the source region 22 and the drain region 23 through the contact holes 70a to passivate the polycrystalline silicon thin film constituting the channel region (second passivation). In step S100, $O_2$ gas or $H_2O$ vapor is supplied for a short time to passivate the active layer 20 constituting the channel region. The $O_2$ gas or $H_2O$ vapor is diffused into the active layer through the contact holes 70b and 70c and passivates the channel region positioned below the gate electrode with the passage of time. In step S100, silicon dangling bonds present on the surface of the active layer 20 are removed by passivation.

In step S100, the second passivation is carried out at a temperature of 200 to 600° C. If the second passivation is carried out at a temperature lower than 200° C., the surface of the active layer may be insufficiently passivated. If the temperature of the second passivation is too high, an oxide film is formed on the surface of the active layer to increase the electrical resistance between the active layer and source and drain electrodes to be formed in the subsequent step. Further, the substrate made of borosilicate is shrunk at too high a passivation temperature. This shrinkage makes it impossible to carry out the subsequent step any further.

Step S100 may be carried out after step S70 to achieve better passivation effects. Step S100 may also be carried out simultaneously with the step of activating the dopant.

Referring to FIG. 3l, in step S110, electrodes 70 (72 and 73) in contact with the source region 22 and the drain region 23 through the contact holes 70a are formed. The source electrode 72 and the drain electrode 73 are formed so as to be in electrical contact with the source region 22 and the drain region 23 of the active layer, respectively. The source electrode 72 and the drain electrode 73 are formed by depositing a conductive material such as aluminum on the upper surface of the interlayer insulating film 60 and patterning the conductive material.

Next, specific embodiments of the method according to the present invention will be explained.

The crystallization of the amorphous silicon thin film formed on the insulating substrate and the first passivation of the polycrystalline silicon thin film are more specifically explained by the following examples.

First, an explanation of a system for carrying out the crystallization of the amorphous silicon thin film and the first passivation is given below.

Figure 4:
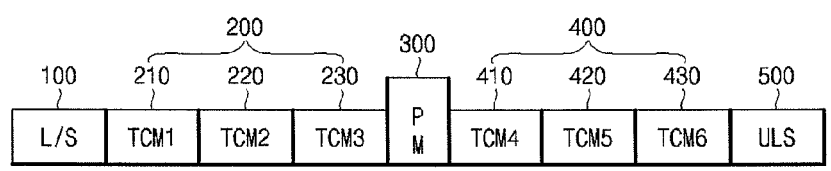
FIG. 4 illustrates the constitution of an in-line system for carrying out the crystallization of an amorphous silicon thin film to form a polycrystalline silicon thin film and the first passivation of the polycrystalline silicon thin film in accordance with a method of the present invention.
Figure 5:
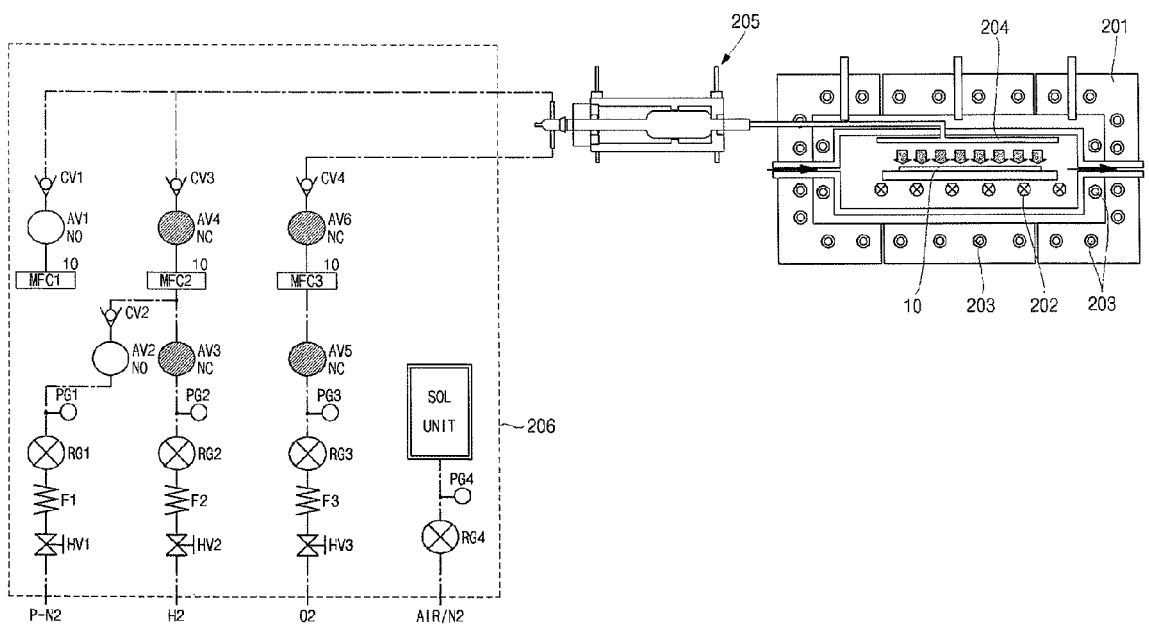
FIG. 5 is a schematic cross-sectional view of a chamber provided with H₂O vapor supply means in the in-line system of FIG. 4.
Figure 6A:
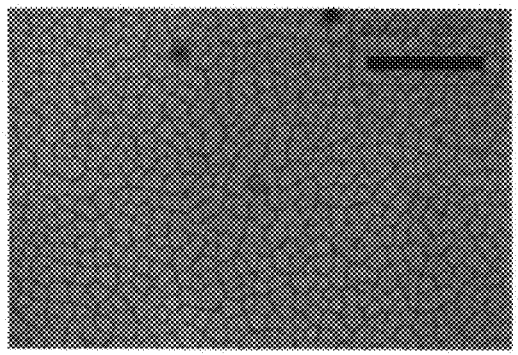
FIGS. 6*a* through 6*e* are micrographs of polycrystalline silicon thin films formed in Example 1.
Figure 6B:
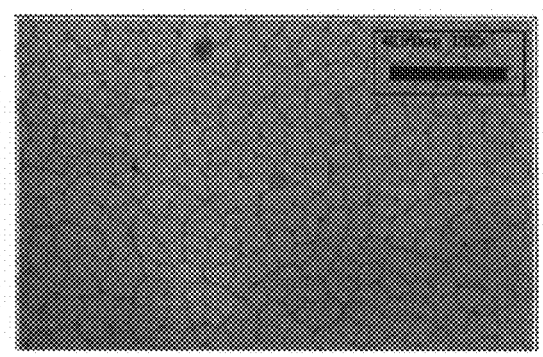
Figure 6C:
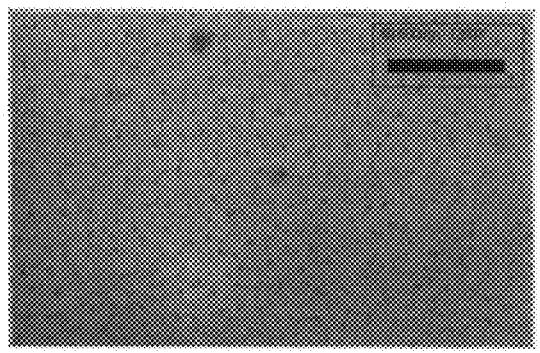
Figure 6D:
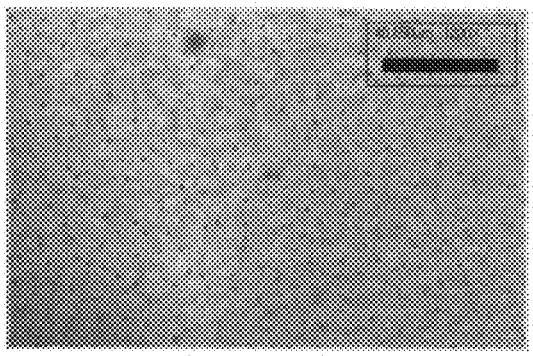
Figure 6E:
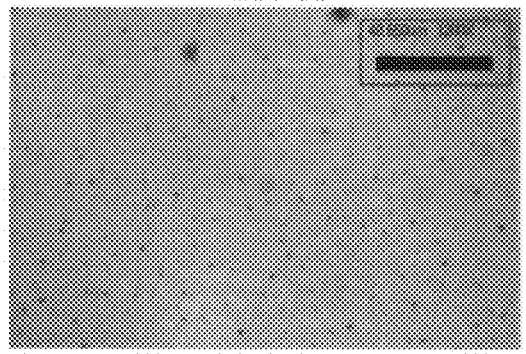
Figure 7A:
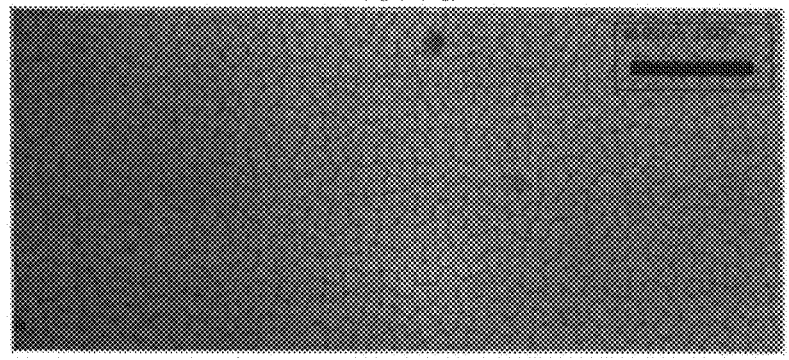
FIGS. 7*a* through 7*d* are micrographs of polycrystalline silicon thin films formed in Example 2.
Figure 7B:
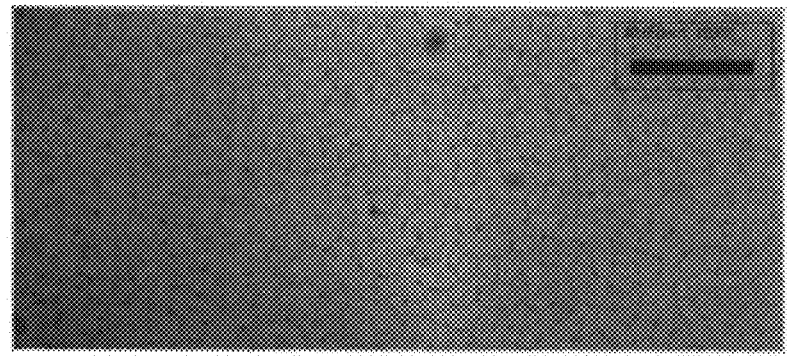
Figure 7C:
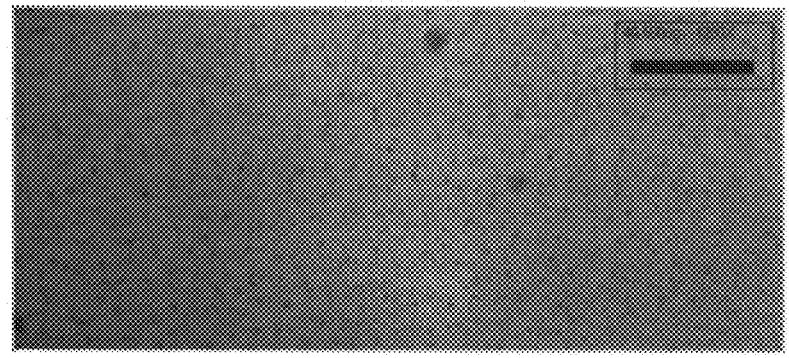
Figure 7D:
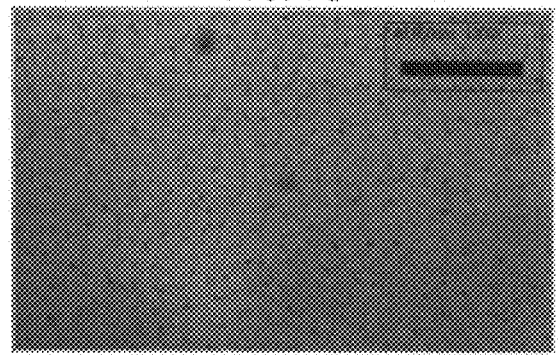
Figure 8A:
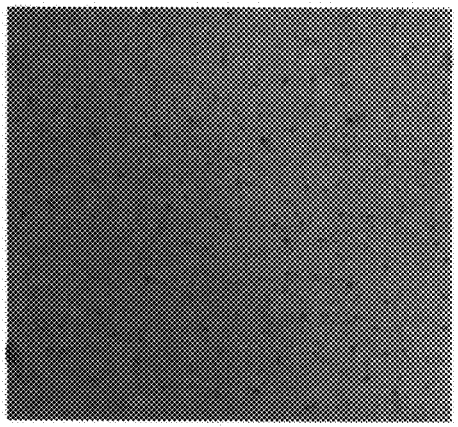
FIGS. 8*a* through 8*e* are micrographs of polycrystalline silicon thin films formed in Example 3.
Figure 8B:
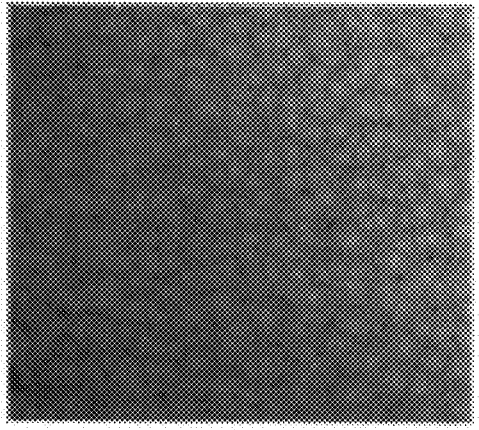
Figure 8C:
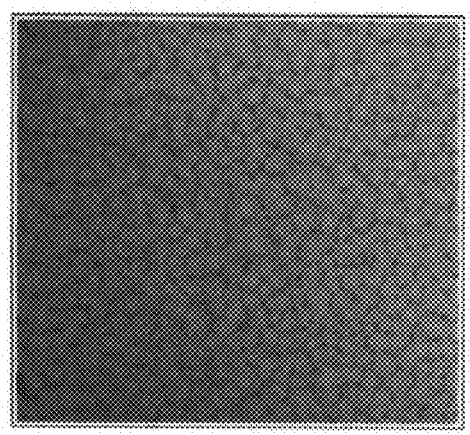
Figure 8D:
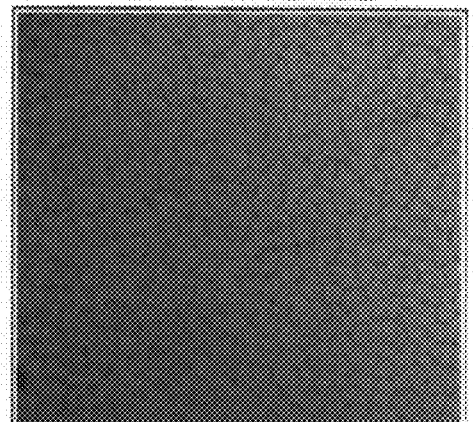
Figure 8E:
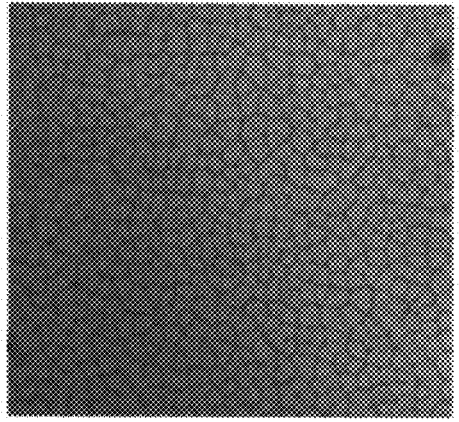

FIG. 4 illustrates the constitution of an in-line system for carrying out the crystallization of the amorphous silicon thin film and the first passivation. FIG. 5 is a schematic cross-sectional view of a chamber provided with $H_2O$ vapor supply means in the in-line system of FIG. 4.

In the following examples, the annealing system filed by the present applicant was used, as mentioned earlier.

Referring to FIG. 4, the in-line system comprises a loading part 100 for loading a semiconductor device, a heating part 200 adjacent to the loading part 100, a processing part 300, a cooling part 400 and an unloading part 500. A semiconductor device is loaded into the heating part 200 through the loading part 100, and the semiconductor device having undergone crystallization and passivation is unloaded from the cooling part 400 through the unloading part 500. Each of the heating part 200 and the cooling part 400 includes three chambers whose temperatures are independently controlled. Specifically, the heating part 200 consists of a first chamber 210, a second chamber 220 and a third chamber 230; and the cooling part 400 consists of a fourth chamber 410, a fifth chamber 420 and a sixth chamber 430. The processing part 300 includes a processing chamber in which the temperature of the amorphous silicon thin film including the insulating substrate to be annealed is uniformly increased by induction heating using a magnetic core and an induction coil for a short period of time. The insulating substrate is loaded into the annealing system while being rested on a setter which minimizes deformation of the insulating substrate. Of course, the processing part 300 may be omitted depending on the annealing temperature in the crystallization of the amorphous silicon thin film.

Referring to FIG. 5, each of the chambers constituting the heating part 200 and the cooling part 400 may include a housing 201, a spray nozzle 204 installed above the insulating substrate 10 inside the housing 201, a vapor generator 205 for supplying vapor to the spray nozzle 204, and a gas supply unit 206 for supplying $H_2$ gas and $O_2$ gas to the vapor generator 205. This chamber configuration is suitable for the passivation of the polycrystalline silicon thin film.

The housing 201 has a space for annealing. The insulating substrate is annealed at a predetermined temperature in the housing 201. The housing 201 includes rollers 202 for transferring the insulating substrate 10 and heaters 203 for increasing the internal temperature.

The spray nozzle 204 is installed over a region where the insulating substrate 10 is transferred to uniformly supply $H_2O$ vapor to the entire surface of the insulating substrate. For efficient supply of $H_2O$ vapor, the spray nozzle 204 includes a plurality of spray holes distributed corresponding to the area of the insulating substrate.

The vapor generator 205 includes a space where $H_2$ gas reacts with $O_2$ gas at 700 to 900° C. to generate $H_2O$ vapor. The vapor generator 205 supplies the $H_2O$ vapor to the spray nozzle 204 through a pipe. The vapor generator 205 may be selected from pyrotorch systems and pyrogenic $H_2O$ vapor generators, which are well known in the art.

The gas supply unit 206 includes pipes for supplying $H_2$ gas and $O_2$ gas to the vapor generator 205 and a plurality of control valves. The gas supply unit 206 may have a construction suitable for gas supply, and a detailed description thereof is omitted herein. The gas supply unit 206 may include $H_2$ gas and $O_2$ gas storage containers. Alternatively, the gas supply unit 206 may be designed to receive $H_2$ gas and $O_2$ gas from the outside through pipes. The gas supply unit 206 is merely illustrative and may have various constitutions. If necessary, the gas supply unit 206 can supply $O_2$ gas only.

Next, an explanation of the crystallization of the amorphous silicon thin films is given.

In the following examples, the amorphous silicon thin films were crystallized using the system of FIG. 4. The amorphous silicon thin films were passed through the heating part 200 and the cooling part 400 whose temperatures were set to predetermined annealing temperatures. The crystallization of the amorphous silicon thin films can also be carried out in a vertical tube furnace that is widely used in semiconductor manufacturing processes.

EXAMPLES

Example 1

The amorphous silicon thin films were crystallized at different temperatures to form polycrystalline silicon thin films. To clearly observe the temperature-dependent crystallization of the amorphous silicon thin films, the annealing time was decreased with increasing annealing temperature. The annealing of the amorphous silicon thin films was performed under the following sets of temperature/time conditions: 600° C./150 minutes (Example 1a), 650° C./80 minutes (Example 1b), 700° C./20 minutes (Example 1c), 750° C./10 minutes (Example 1d), and 800° C./5 minutes (Example 1e). The metal catalyst was doped at the same concentration ($2\times10^{13}$/cm$^2$).

Example 2

In this example, the amorphous silicon thin films were crystallized for different periods of time while maintaining the annealing temperature constant to form polycrystalline silicon thin films. Specifically, the amorphous silicon thin films were annealed at 700° C. for 5 minutes (Example 2a), 10 minutes (Example 2b), 20 minutes (Example 2c) and 40 minutes (Example 2d). The metal catalyst was doped at the same concentration ($2\times10^{13}$/cm$^2$).

Example 3

In this example, the amorphous silicon thin films were crystallized by doping the metal catalyst at different concentrations while maintaining the annealing temperature and time constant. Specifically, the metal catalyst was doped at different concentrations: $5\times10^{11}$/cm$^2$ (Example 3a), $2\times10^{12}$/cm$^2$ (Example 3b), $2\times10^{13}$/cm$^2$ (Example 3c), $6\times10^{14}$/cm$^2$ (Example 3d) and $5\times10^{15}$/cm$^2$ (Example 3e). The doped amorphous silicon thin films were annealed at the same temperature (750° C.) for the same period of time (5 minutes) to form polycrystalline silicon thin films.

The results obtained after the annealing of the amorphous silicon thin films under the different crystallization conditions in Examples 1-3 were evaluated as follows.

Each of the polycrystalline silicon thin films was etched. The morphology of grain boundaries of the etched thin film was observed. When a general polycrystalline silicon thin film is etched, a metal silicide present at grain boundaries of the polycrystalline silicon thin film is also etched, and as a result, the grain boundaries are observed. Accordingly, if no grain boundaries are observed in the polycrystalline silicon thin film after etching, the metal silicide is absent at the grain boundaries.

FIGS. 6a through 6e are micrographs of the polycrystalline silicon thin films formed in Example 1, i.e. Example 1a, Example 1b, Example 1c, Example 1d and Example 1e.

The images show that the metal silicide present at grain boundaries of the polycrystalline silicon thin films was distributed at specific locations of the grain boundaries, for example, the metal silicide was localized at corners where the grain boundaries meet, with increasing annealing temperature. Since the metal silicide was distributed along the grain boundaries of the polycrystalline silicon thin film formed by annealing at a temperature of 600° C., the grain boundaries were observed to some extent. Even in this case, however, the metal silicide was not uniformly distributed along the grain boundaries of the polycrystalline silicon thin film. Few grain boundaries were observed in the polycrystalline silicon thin film formed by annealing at a temperature of 800° C. That is, the metal silicide appeared in the form of dots at specific locations of the polycrystalline silicon thin film. In conclusion, as the annealing temperature increased, the metal silicide was localized at specific locations of the grain boundaries in the polycrystalline silicon thin films.

FIGS. 7a through 7d are micrographs of the polycrystalline silicon thin films formed in Example 2, i.e. Example 2a, Example 2b, Example 2c and Example 2d.

The images show that the metal silicide present at grain boundaries of the polycrystalline silicon thin films was distributed at specific locations of the grain boundaries, for example, the metal silicide was localized at corners where the grain boundaries meet, with increasing annealing time. Since the metal silicide was distributed along the grain boundaries of the polycrystalline silicon thin film formed by annealing for 5 minutes, the grain boundaries were observed to some extent. Even in this case, however, the metal silicide was not uniformly distributed along the grain boundaries of the polycrystalline silicon thin film. Few grain boundaries were observed in the polycrystalline silicon thin film formed by annealing for 40 minutes. That is, the metal silicide appeared in the form of dots at specific locations of the polycrystalline silicon thin film. In conclusion, as the annealing time increased, the metal silicide was localized at specific locations of the grain boundaries in the polycrystalline silicon thin films.

FIGS. 8a through 8d are micrographs of the polycrystalline silicon thin films formed in Example 3, i.e. Example 3a, Example 3b, Example 3c and Example 3d.

The images show that the metal silicide present at grain boundaries of the polycrystalline silicon thin films was distributed at specific locations of the grain boundaries, for example, the metal silicide was localized at corners where the grain boundaries meet, with decreasing concentration of the metal catalyst doped. Few grain boundaries were observed in the polycrystalline silicon thin film formed using the metal catalyst at a relatively low concentration of $5\times10^{11}$/cm$^2$ because the metal silicide was distributed at specific locations of grain boundaries in the polycrystalline silicon thin film. In contrast, it was found that the metal silicide was distributed throughout the grain boundaries of the polycrystalline silicon thin film using the metal catalyst at a relatively high concentration of $5\times10^{15}$/cm$^2$. Even in this case, however, the metal silicide was not uniformly distributed along the grain boundaries of the polycrystalline silicon thin film. That is, as the concentration of the metal catalyst decreased, the metal silicide appeared in the form of dots at specific locations of the polycrystalline silicon thin film. These results indicate that the amount of the metal silicide formed was relatively small as the concentration of the metal catalyst decreased.

Next, an explanation of the passivation of the amorphous silicon thin films is given.

Figure 9:
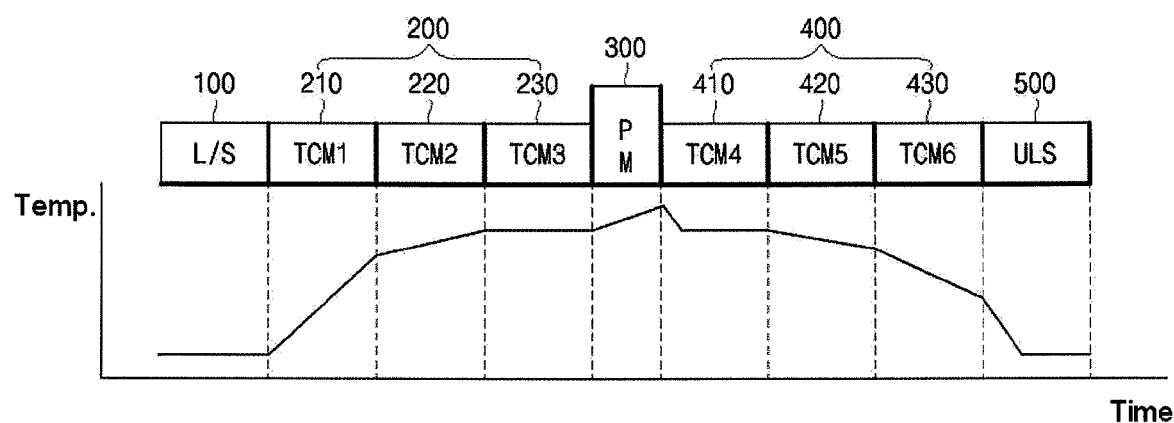
FIG. 9 is an annealing curve during crystallization of an amorphous silicon thin film using the in-line system of FIG. 4.

FIG. 9 is an annealing curve during passivation of the amorphous silicon thin films using the in-line system of FIG. 4. In Example 4, heating, induction annealing and cooling were sequentially conducted (FIG. 9) in order to crystallize the amorphous silicon thin film before passivation. In Example 4, Ni as a metal catalyst was doped into the surface of the amorphous silicon thin film for rapid crystallization. The doping was performed together with the first passivation in the same chambers of the in-line system. The first passivation can also be sequentially carried out in the different chambers of the in-line system. On the other hand, the steps other than crystallization and passivation were carried out by methods generally known in the art.

Table 1 shows temperature conditions for the first passivation in Example 4 and Comparative Examples 1 and 2. All temperatures in Table 1 are expressed in degrees Celsius.

TABLE 1

| | TCM1 | | TCM2 | | TCM3 | | PM | | TCM4 | | TCM5 | | TCM6 | |
|---|---|---|---|---|---|---|---|---|---|---|---|---|---|---|
| | Temp. | Vapor | Temp. | Vapor | Temp. | Vapor | Temp. | Vapor | Temp. | Vapor | Temp. | Vapor | Temp. | Vapor |
| Example 4 | 700 | X | 700 | X | 750 | ○ | 850 | ○ | 750 | ○ | 600 | ○ | 450 | ○ |
| Comparative Example 1 | 700 | X | 700 | X | 750 | X | 850 | X | 750 | X | 600 | X | 450 | X |
| Comparative Example 2 | 670 | X | 700 | X | 700 | ○ | 800 | ○ | 700 | X | 550 | X | 400 | X |

As shown in Table 1, the heating chambers were set to two different temperatures, the cooling chambers were set to three different temperatures, and the induction annealing temperature was set to 850° C. in Example 4. H$_2$O vapor was supplied during heating, induction annealing and cooling to carry out the crystallization of the amorphous silicon thin film together with the passivation of the polycrystalline silicon thin film.

In Comparative Examples 1 and 2, the temperature and H$_2$O vapor supply conditions in Example 4 were varied.

Example 4

The temperatures of the first chamber 210, the second chamber 220 and the third chamber 230 were set to 700, 700 and 750° C., respectively. The processing chamber of the processing part 300 was set to a temperature of 850° C. The temperatures of the fourth chamber 410, the fifth chamber 420 and the sixth chamber 430 were set to 750, 600 and 450° C., respectively. The insulating substrate, on which the amorphous silicon thin film was formed, was loaded into the first chamber 210 through the loading part 100. The insulating substrate was sequentially heated while passing through the first, second and third chambers. Due this heating, the deformation of the insulating substrate was minimized and the amorphous silicon thin film was crystallized before passivation. The insulating substrate was cooled while passing through the fourth, fifth and sixth chambers. Then, the cooled insulating substrate was withdrawn through the unloading part 500.

In Example 4, H$_2$O vapor was supplied to the third chamber 230, the processing part 300, the fourth chamber 410, the fifth chamber 420 and the sixth chamber 460 to oxidize the surface of the polycrystalline silicon thin film. As a result, a passivation film was formed as an oxide film on the polycrystalline silicon thin film. The passivation film was formed at a temperature higher than 700° C.

The time ("oxidation time" (T$_{oxidation}$)) required to form the oxide film on the polycrystalline silicon thin film by the supply of the H$_2$O vapor was divided into 5, 15, 30 and 60 minutes.

Thereafter the subsequent steps were carried out to manufacture the thin film transistor.

Comparative Example 1

The procedure of Example 4 was repeated, except that no H$_2$O vapor was supplied to all chambers. As a result, no passivation film was formed on the amorphous silicon thin film.

Comparative Example 2

The procedure of Example 4 was repeated, except that the first chamber 210, the second chamber 220, the third chamber 230, the processing part 300, the fourth chamber 410, the fifth chamber 420 and the sixth chamber 430 were set to lower temperatures: i.e. 670, 700, 700, 700, 800, 700, 550 and 400° C.

The oxidation time required to form an oxide film on the surface of the silicon thin film by the supplied H$_2$O vapor was divided into 5, 15 and 30 minutes.

The characteristics of the polycrystalline silicon thin films and the thin film transistors manufactured in Example 4 and Comparative Examples 1 and 2 were evaluated.

<Crystallinity Evaluation>

The crystallinity of the polycrystalline silicon thin films is associated with the crystalline state of the silicon thin films and is an indirect measure of the electron and hole mobility of the thin film transistors.

Figure 10A:
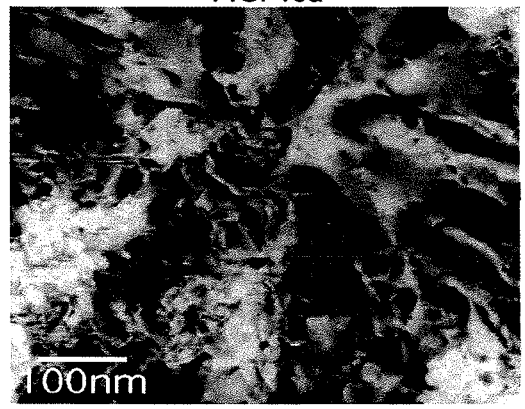
FIGS. 10*a* and 10*b* are scanning electron microscopy images of polycrystalline silicon thin films formed in Example 4 and Comparative Example 1.
Figure 10B:
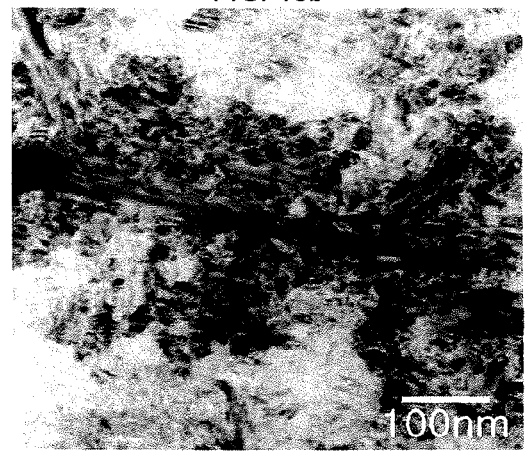

The crystallinity of the polycrystalline silicon thin films was evaluated by observing the structures of the polycrystalline silicon thin films using a scanning electron microscope. FIGS. 10a and 10b are scanning electron microscopy images of the polycrystalline silicon thin films formed in Example 4 and Comparative Example 1. The images reveal that the crystallinity of the polycrystalline silicon thin film formed in Example 4 was better than that of the polycrystalline silicon thin film formed in Comparative Example 1. Specifically, twin defects, which are characteristics inherent to the microstructures of typical solid-phase crystallized silicon films, and fine subgrains within the grain boundaries were observed in the polycrystalline silicon thin film of Comparative Example 1, whereas the number of defects decreased, single grains were formed, grain boundaries were distinct, and intragranular twin defects disappeared in the polycrystalline silicon thin film formed in Example 4.

<Evaluation of UV Slope Value and Wavelength Variations>

Changes in UV slope value and wavelength of each of the polycrystalline silicon thin films were measured to evaluate the formation of an oxide film as a passivation film on the surface of the polycrystalline silicon thin film.

Figure 11A:
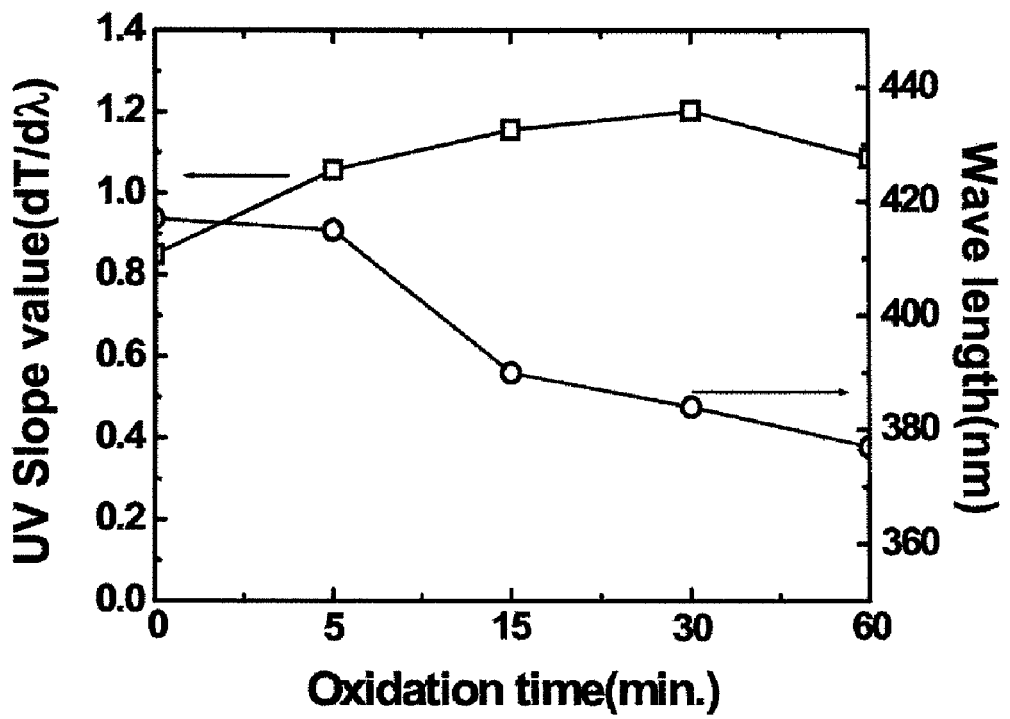
FIGS. 11*a* and 11*b* are graphs showing changes in the UV slope value and wavelength of polycrystalline silicon thin films formed in Example 4 and Comparative Example 2 as a function of oxidation time, respectively.
Figure 11B:
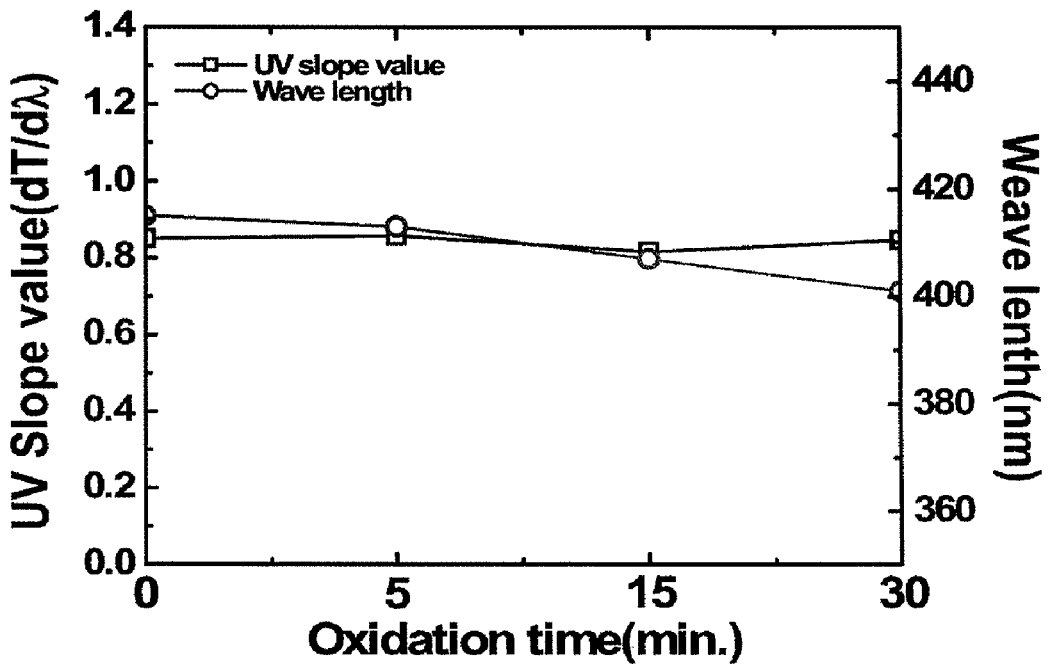

FIGS. 11a and 11b are graphs showing changes in the UV slope value and wavelength of the polycrystalline silicon thin films formed in Example 4 and Comparative Example 2 as a function of oxidation time, respectively.

Referring to FIG. 11a, the UV slope value of the polycrystalline silicon thin film formed in Example 4 increased and the wavelength of the polycrystalline silicon thin film was shortened with increasing oxidation time. The shift in the wavelength of the polycrystalline silicon thin film to a shorter wavelength with increasing oxidation time indicates an improvement in crystallinity and the formation of a heterointerface between the polycrystalline silicon thin film and the overlying oxide film. The UV slope value of the polycrystalline silicon thin film decreased after oxidation for a long time (60 min.), indicating a decrease in the thickness of the polycrystalline silicon thin film resulting from the formation of an oxide film. From these results, it can be known that the oxide film was sufficiently formed on the polycrystalline silicon thin film of Example 4 and a new interface between the polycrystalline silicon thin film and the oxide film was formed. Particularly, 5 minutes after oxidation, there were significant changes in the UV slope value and wavelength of the polycrystalline silicon thin film of Example 4. These results lead to the conclusion that the oxidation time is preferably set to 5 minutes or more.

Referring to FIG. 11b, no changes were observed in the UV slope value and the wavelength of the polycrystalline silicon thin film formed in Comparative Example 2 despite increasing oxidation time. These results indicate that an oxide film as a passivation film was not sufficiently formed on the polycrystalline silicon thin film.

<Evaluation of Passivation Film Thickness>

Figure 12:
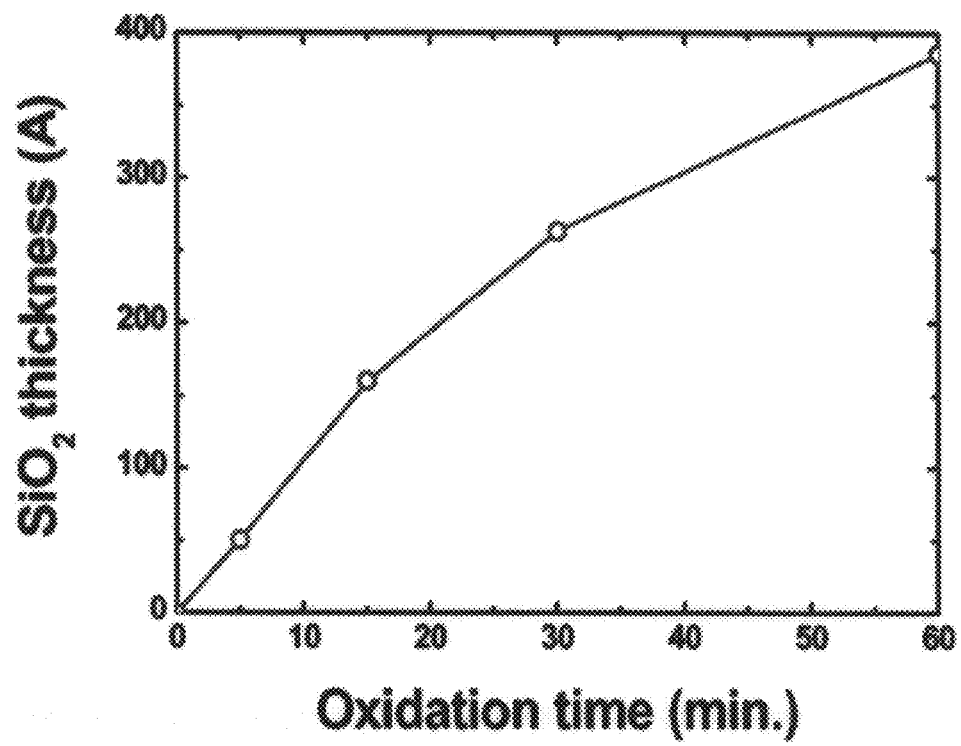
FIG. 12 is a graph showing a change in the thickness of a passivation film formed on a polycrystalline silicon thin film in Example 4 as a function of oxidation time.

FIG. 12 is a graph showing a change in the thickness of the passivation film formed on the polycrystalline silicon thin film in Example 4 as a function of oxidation time.

Referring to FIG. 12, the passivation film became thicker with increasing oxidation time. Taking into account the conclusion that the oxidation time is preferably set to 5 minutes or more from the results obtained in the evaluation of the UV slope value and wavelength variations of the polycrystalline silicon thin film, it is preferred that the passivation film has a thickness of at least 50 Å.

<Evaluation of Electrical Properties of Passivation Film>

Figure 13:
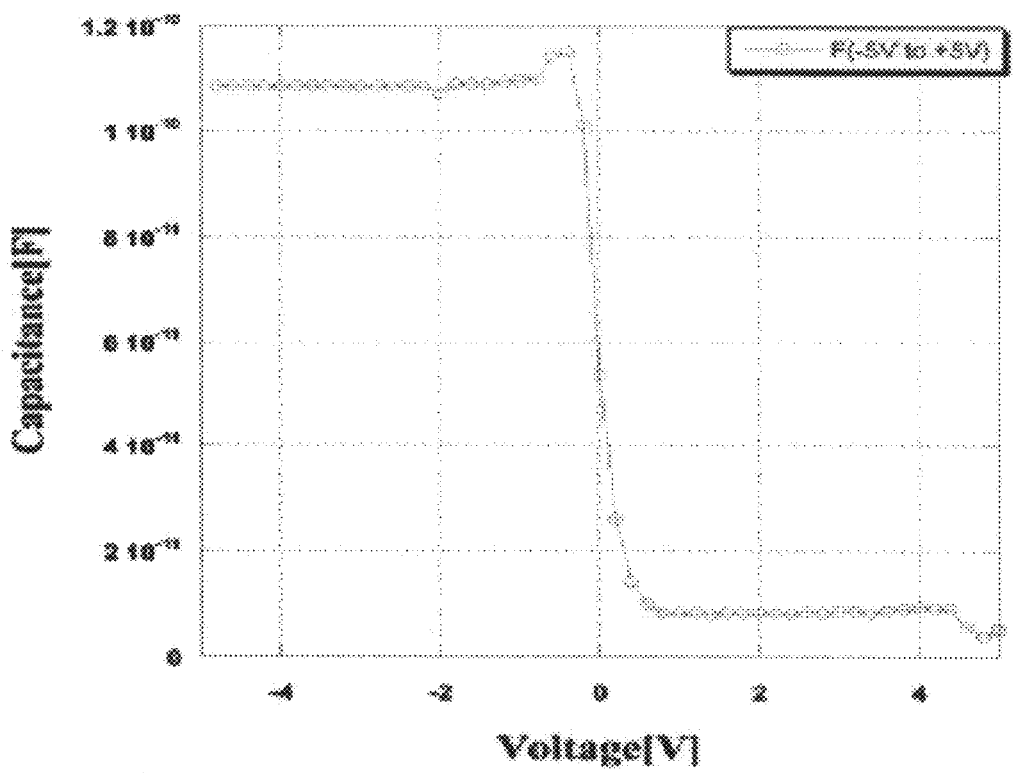
FIG. 13 shows the electrical properties of an oxide film formed in Example 4.

FIG. 13 shows the electrical properties of the passivation film formed in Example 4. The electrical properties of the passivation film were measured using a mercury probe at a frequency of 1 MHz and an OSC of 25 mV. The passivation film was found to have a dielectric constant of 3.9 F/cm and an interface trap density of $5 \times 10^{11}/cm^2$, indicating the passivation film was a good dielectric material.

<Characterization of Thin Film Transistors>

Figure 14B:
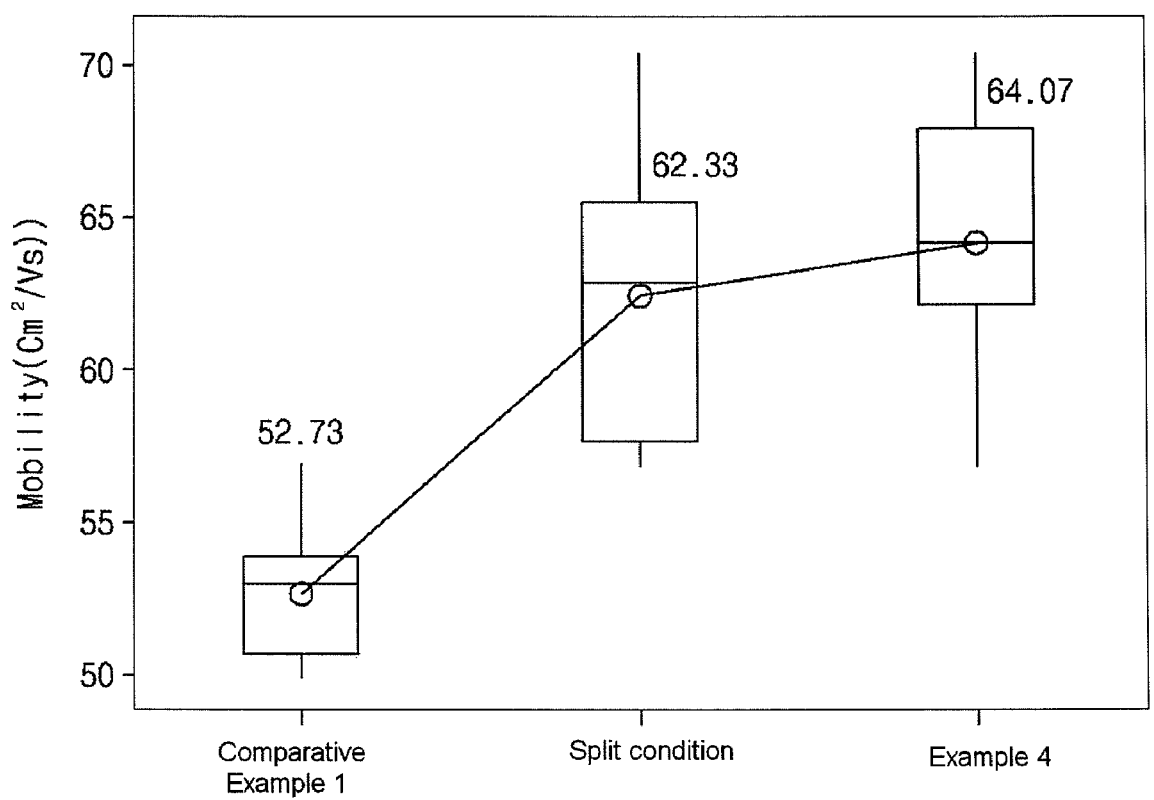

FIGS. 14a and 14b are graphs showing the off-current ($I_{off}$) and electron mobility of the thin film transistors manufactured in Example 4 and Comparative Example 1.

Each of the graphs further contains the results of a transistor thin film in which the passivation film was removed from the surface of the polycrystalline silicon thin film of Example 4 using hydrofluoric acid (HF) (split condition).

Referring to FIG. 14a, the thin film transistor of Example 4 had an off-current ($I_{off}$) of 1.6 pA/μm, which is lower than that (44 pA/μm) of the thin film transistor of Comparative Example 1. The off-current of the transistor (split condition) was higher than that of the transistor manufactured in Example 4. The reason is believed to be because the interface of the polycrystalline silicon thin film was damaged by the hydrofluoric acid upon removal of the oxide film.

Referring to FIG. 14b, the thin film transistor of Example 4 had a carrier mobility of 64 $cm^2$/Vs, which is higher than that (52 $cm^2$/Vs) of the thin film transistor of Comparative Example 1. The mobility (62.33 $cm^2$/Vs) of the transistor (split condition) was lower than that of the transistor manufactured in Example 4.

As is apparent from the foregoing, according to the method of these aspects of the present invention, the regions of the metal silicide deposited and distributed at grain boundaries of the polycrystalline silicon thin film can be reduced. Therefore, the polycrystalline silicon thin film can be formed uniformly as a whole, and the current characteristics and the electron mobility of the final thin film transistor can be improved.

In addition, according to the method of these aspects of the present invention, $O_2$ gas or $H_2O$ vapor is supplied to passivate the polycrystalline silicon thin film. As a result, silicon dangling bonds present on the surface of the polycrystalline silicon thin film are strongly passivated, so that improved characteristics (e.g., improved current characteristics and high electron mobility) of the final thin film transistor can be achieved.

Furthermore, according to the method of these aspects of the present invention, crystallization of the amorphous silicon thin film can be carried out together with passivation, which reduces the number of processing steps and the processing time.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for manufacturing a thin film transistor, comprising
    forming an amorphous silicon thin film on an insulating substrate;
    crystallizing the amorphous silicon thin film to form a polycrystalline silicon thin film; supplying oxygen ($O_2$) gas or water ($H_2O$) vapor to the surface of the polycrystalline silicon thin film to form an oxide film as a passivation film on the polycrystalline silicon thin film (first passivation);
    patterning the polycrystalline silicon thin film and the passivation film to transform the polycrystalline silicon thin film into an active layer;
    forming a gate insulating film over the polycrystalline silicon thin film and the passivation film;
    forming a gate electrode on the gate insulating film and dividing the polycrystalline silicon thin film into a channel region opposite to the gate electrode and first and second regions separated by the channel region;
    implanting a p-type or n-type dopant into the first and second regions to form source/drain regions;
    forming an interlayer insulating film over the gate electrode and the gate insulating film;
    etching the interlayer insulating film, the gate insulating film and the passivation film to form a first contact hole and a second contact hole in contact with the source and drain regions, respectively;
    supplying $O_2$ gas or $H_2O$ vapor to the upper surfaces of the source and drain regions to passivate the active layer (second passivation) after the step of forming the contact holes; and
    forming a source electrode and a drain electrode in contact with the source region and the drain region through the first and second contact holes, respectively.

2. The method of claim 1, further comprising forming a buffer layer between the upper surface of the insulating substrate and the amorphous silicon thin film.

3. The method of claim 1, wherein the amorphous silicon thin film is doped with a metal catalyst and is annealed at a temperature of 600 to 850° C. for 5 to 150 minutes.

4. The method of claim 1, wherein the crystallization of the amorphous silicon thin film is carried out by annealing in such a manner that the annealing time becomes shorter as the annealing temperature increases.

5. The method of claim 1, wherein the amorphous silicon thin film is crystallized at a temperature of at least 800° C. by solid-phase crystallization.

6. The method of claim 1, wherein the amorphous silicon thin film is doped with a metal catalyst at a concentration of from $1 \times 10^{11}$ to $1 \times 10^{16}/cm^2$.

7. The method of claim 1, wherein the first passivation is carried out by heating and cooling the amorphous silicon thin film.

8. The method of claim 1, wherein the first passivation is carried out at a temperature of 700 to 800° C.

9. The method of claim 1, wherein the $H_2O$ vapor is produced by the reaction of hydrogen ($H_2$) and oxygen ($O_2$) at a temperature of 700 to 900° C. ('pyrotorch technique') or by heating deionized water to at least 20° C.

10. The method of claim 1, wherein the passivation film has a thickness of a single atomic layer to hundreds of angstroms.

11. The method of claim 1, wherein the second passivation is carried out at a temperature of 200 to 600° C.

12. The method of claim 1, wherein the first passivation and the second passivation are carried out in an in-line system having a plurality of independent chambers or a vertical tube furnace having a vertically standing chamber.

* * * * *